(12) United States Patent
Akkem

(10) Patent No.: US 11,671,114 B2
(45) Date of Patent: Jun. 6, 2023

(54) REDUCED COMPLEXITY DECODER WITH IMPROVED ERROR CORRECTION AND RELATED SYSTEMS METHODS AND DEVICES

(71) Applicant: Microchip Technology Incorporated, Chandler, AZ (US)

(72) Inventor: Sailaja Akkem, Austin, TX (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 17/448,097

(22) Filed: Sep. 20, 2021

(65) Prior Publication Data
US 2022/0116058 A1  Apr. 14, 2022

Related U.S. Application Data

(60) Provisional application No. 63/198,358, filed on Oct. 13, 2020.

(51) Int. Cl.
  *H03M 13/11*  (2006.01)
(52) U.S. Cl.
  CPC ................ *H03M 13/1125* (2013.01)
(58) Field of Classification Search
  CPC .................................. H03M 13/1125
  See application file for complete search history.

(56) References Cited

U.S. PATENT DOCUMENTS

| | | | |
|---|---|---|---|
| 9,092,353 B1 | 7/2015 | Micheloni et al. | |
| 2006/0195761 A1* | 8/2006 | Kim ................... | H03M 13/1182 714/758 |
| 2007/0083802 A1* | 4/2007 | Xin ..................... | H03M 13/1111 714/752 |
| 2007/0153726 A1 | 7/2007 | Bar-Sade et al. | |
| 2009/0086638 A1* | 4/2009 | Niu ....................... | H04L 1/0084 370/238 |

(Continued)

FOREIGN PATENT DOCUMENTS

WO    2020/131056 A1    6/2020

OTHER PUBLICATIONS

Amendment 7: Media Access Control Parameters, Physical Layers, and Management Parameters for 2.5 GB/s and 5 GB/s Operation, Types 2.5GBASE-T and 5GBASE-T (Year: 2016).

(Continued)

*Primary Examiner* — Joseph D Torres
(74) *Attorney, Agent, or Firm* — TraskBritt

(57) ABSTRACT

Reduced complexity decoders with improved error correction and related systems, methods, and apparatuses are disclosed. An apparatus includes an input terminal and a processing circuitry. The input terminal is provided at a physical layer device to receive, from a network, a low density parity check (LDPC) frame including bits. The bits correspond to log-likelihood ratio (LLR) messages indicating probabilities that the bits have predetermined logic values. The processing circuitry is to saturate LLR values of a portion of the LLR messages corresponding to known bits of the LDPC frame to a highest magnitude value represented by the LLR messages, and pass the LLR messages between check nodes and message nodes. The message nodes correspond to the bits. The check nodes correspond to parity check equations of a parity check matrix.

14 Claims, 7 Drawing Sheets

(56) References Cited

U.S. PATENT DOCUMENTS

| | | | |
|---|---|---|---|
| 2010/0146365 A1* | 6/2010 | Yano | H03M 13/255 |
| | | | 714/752 |
| 2011/0191653 A1* | 8/2011 | Zeng | H03M 13/1111 |
| | | | 714/763 |
| 2017/0359147 A1* | 12/2017 | Park | H03M 13/255 |
| 2019/0068314 A1 | 2/2019 | Park et al. | |
| 2019/0149169 A1* | 5/2019 | Chang | H03M 13/1111 |
| | | | 714/752 |

OTHER PUBLICATIONS

International Search Report from International Application No. PCT/US2021/071514, dated Nov. 29, 2021, 5 pages.

International Written Opinion from International Application No. PCT/US2021/071514, dated Nov. 29, 2021, 9 pages.

Shirani et al., "PMA/PCS Consensus Baseline Proposal; Shirani_3bz_02_0515", IEEE Draft Shirani_3BZ_02_0515, IEEE-SA, Piscataway, NJ USA, vol. 802.3 (May 21, 2015) pp. 1-6.

* cited by examiner

REDUCED COMPLEXITY DECODER WITH IMPROVED ERROR CORRECTION AND RELATED SYSTEMS METHODS AND DEVICES

CROSS-REFERENCE TO RELATED APPLICATION

This application claims the benefit under 35 U.S.C. § 119(e) of the priority date of U.S. Provisional Patent Application Ser. No. 63/198,358, filed Oct. 13, 2020, the disclosure of which is hereby incorporated herein in its entirety by this reference.

TECHNICAL FIELD

This disclosure relates generally to reduced complexity decoders with improved error correction, and more particularly to low-power, low-density parity check (LDPC) decoders to be used in physical layer devices of networks such as wired local area networks.

BACKGROUND

The Institute of Electrical and Electronics Engineers (IEEE) regulates operation of decoders in wired local area networks such as Ethernet in the 2.5/5G standard (IEEE 802.3bz). Error correction is important in Ethernet. The 2.5G/5G standard mandates that bit error rate (BER) be as low as $10^{12}$. LDPC algorithms may be used to enable such a low BER. Data from higher layers than a physical layer in a network stack are encoded into an LDPC frame by the transmitter (each LDPC frame is of size 2048 bits, out of which 325 bits are parity bits and 1723 bits are message bits). Such an LDPC frame is decoded by an LDPC decoder of a receiver upon reception.

BRIEF DESCRIPTION OF THE DRAWINGS

While this disclosure concludes with claims particularly pointing out and distinctly claiming specific examples, various features and advantages of examples within the scope of this disclosure may be more readily ascertained from the following description when read in conjunction with the accompanying drawings, in which:

DETAILED DESCRIPTION

Figure 1:
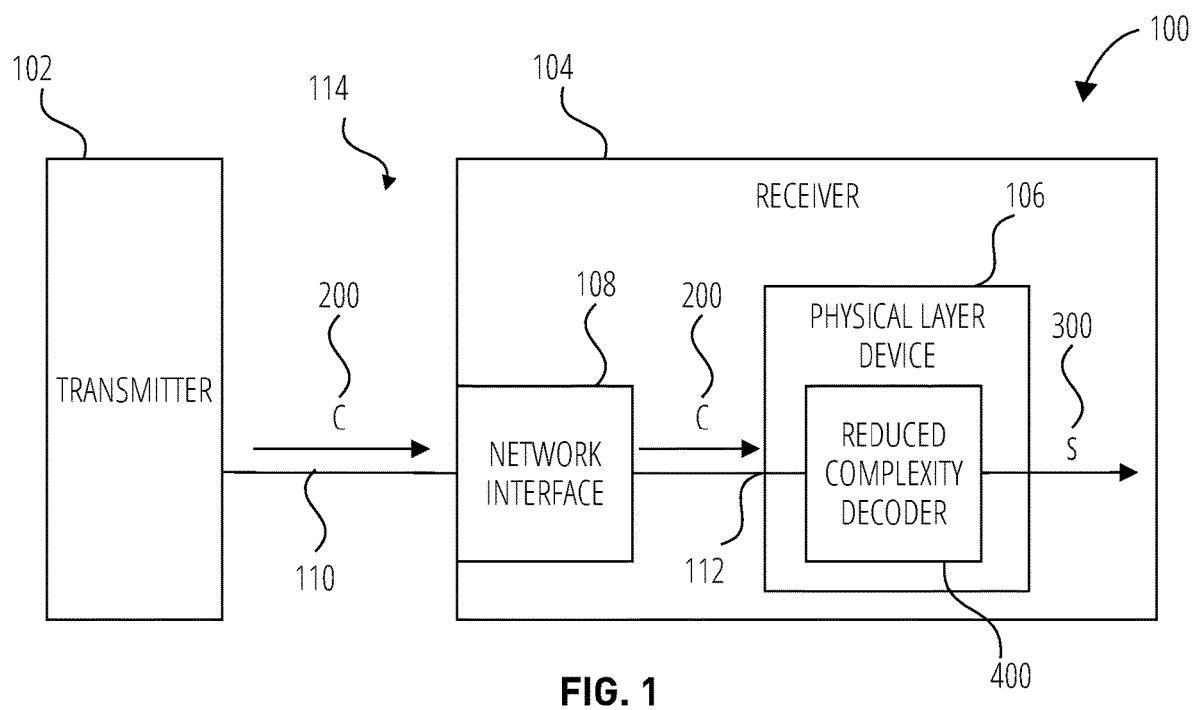
FIG. 1 is a block diagram of a communication system 100, according to various examples.

In the following detailed description, reference is made to the accompanying drawings, which form a part hereof, and in which are shown, by way of illustration, specific examples of examples in which the present disclosure may be practiced. These examples are described in sufficient detail to enable a person of ordinary skill in the art to practice the present disclosure. However, other examples enabled herein may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example or this disclosure to the specified components, steps, features, functions, or the like.

It will be readily understood that the components of the examples as generally described herein and illustrated in the drawings could be arranged and designed in a wide variety of different configurations. Thus, the following description of various examples is not intended to limit the scope of the present disclosure, but is merely representative of various examples. While the various aspects of the examples may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the examples disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is to execute computing instructions (e.g., software code, without limitation) related to examples of the present disclosure.

The examples may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

LDPC decoding passes incoming soft log-likelihood ratio (LLR) messages between check nodes and message nodes until the algorithm converges. Some calculations are done on LLRs at check nodes. Corrections to the calculated LLRs are done at message nodes. There are 384 check nodes and 2048 message nodes specified by 2.5G/5G. One such passage of LLR (from message to check node and back) is referred to herein as an "iteration."

Each iteration is divided into six sub-iterations, and each sub-iteration (accounting for 64 check nodes) is executed in one clock cycle. Each sub-layer executes an algorithm including a Q calculation, an R calculation, an L calculation, and a decision, which are defined as:

Q Calculation:

$$Q_i = L_i - \overline{R}_{l,i}$$

R Calculation:

$$\overline{R}_{l,i} \leftarrow \max\left\{\min_{i' \in P_{l,i}/i} \{|Q_{i'}|\} - \beta, 0\right\} \prod_{i' \in P_{l,i}/i} \mathrm{sgn}(Q_{i'})$$

$$\beta = 0;$$

$R_{l,i}$ is normalized by a factor of 0.5

L Calculation:

$$L_i \leftarrow Q_i + R_{l,i}$$

Decision:

$$v = \begin{cases} 1 & \text{if } L \leq 0 \\ 0 & \text{if } L > 0 \end{cases}$$

If $v*H^T=0$, decoded vector v is correct.

If the decoded vector is correct by the end of any sub-iteration, then the algorithm is determined to have converged and is not executed further. Q is initialized to LLR coming from the line for the first sub-iteration of the first iteration.

The decoder may be designed for the maximum number of iterations (e.g., ten iterations, without limitation). However, as soon as the algorithm converges for one LDPC frame, the design will be clock gated for the rest of the clocks for that frame.

This Q calculation, R calculation, L calculation, decision algorithm of decoding uses soft log-likelihood ratios as received from the line for each message bit and uses these LLR values in decoding the message bits. Known information from the LDPC frame is not used, which causes the decoding to use a larger number of sub-layer iterations than examples disclosed herein. For example, for 2.5G/5G, the last 97 bits before parity in every LDPC frame are zeros. In examples disclosed herein, error correction numbers may be improved by using known information in the LDPC frame. For example, the LLR for those 97 messages may be saturated to the most positive value, which causes the algorithm to converge in a reduced number of iterations.

Examples disclosed herein improve error correction by correcting a larger number of bits when compared to the Q calculation, R calculation, L calculation, decision algorithm discussed above for 2.5G/5G, thus improving the BER for the same SNR signal quality. Also, examples disclosed herein may achieve algorithm convergence in fewer clock cycles compared to the Q calculation, R calculation, L calculation, decision algorithm discussed above. Accordingly, the design may be clock-gated for the rest of the sub-iterations for power savings. Furthermore, examples disclosed herein require no additional hardware above hardware associated with the Q calculation, R calculation, L calculation, decision algorithm discussed above.

For the LDPC algorithm at 2.5G/5G speeds, every message bit contributes to six different check nodes. Also, every check node works on soft LLR messages from 32 different message nodes.

An LLR message is an indicator of the probability that the received bit is zero or if the received bit is one. At any message node, if the LLR message is weaker, it implies that the uncertainty in making a decision for that message bit is higher. Nodes with relatively strong LLR may be referred to herein as "certain" message nodes.

Error in any message node would have to be corrected by six different check nodes that it contributes to. These six different check nodes may be affected by the incoming 32 messages to each of them. Accordingly, the algorithm works by the criterion that at each check node messages with weaker log likelihood ratio are strengthened by virtue of other messages that have a reasonably stronger log likelihood ratio. LDPC algorithms provide good error correction while keeping the decoder simple. LDPC decoding algorithms exhibit good error correction when they are run for more iterations. More iterations, however, results in higher power consumption because it takes additional clock cycles to run the decoding engine through iterations. Accordingly, design tradeoffs exist between power consumption and better error correction. Examples disclosed herein enable improvement of bit error correction without increasing power consumption.

Disclosed herein are more certain message nodes contributing to a check node. The strength of such message nodes is improved to provide better error correction. Accordingly, error correction factor and convergence rate are improved by strengthening message bits that are specified by the 2.5G/5G standard to be static or fixed. This is achieved using known information of the LDPC frame.

Examples disclosed herein provide for improvement in the number of uncorrected errors, and in a reduction in the number of sub-layer runs needed for algorithm convergence. Improvement in the number of uncorrected errors improves the BER. Reduction in the number of sub-layer runs may provide significant power savings, as the design will be clock gated for those unused sub-layers for each frame.

In various examples an apparatus includes an input terminal and a processing circuitry. The input terminal is provided at a physical layer device to receive, from a network, an LDPC frame including bits. The bits correspond to LLR messages indicating probabilities that the bits have predetermined logic values. The processing circuitry is to saturate LLR values of a portion of the LLR messages corresponding to known bits of the LDPC frame to a highest magnitude value represented by the LLR messages and pass the LLR messages between check nodes and message nodes. The message nodes correspond to the bits. The check nodes correspond to parity check equations of a parity check matrix.

In various examples a method of decoding an LDPC frame includes receiving, at a physical layer device, the LDPC frame including known bits and unknown bits, the known bits having known values. The method also includes saturating LLR values of at least a portion of LLR messages corresponding to the known bits to a highest possible magnitude. The LLR messages indicate probabilities that the bits have predetermined logic values. The method also includes passing the LLR messages between check nodes and message nodes, the message nodes corresponding to the bits, the check nodes corresponding to parity check equations of a parity check matrix.

In various examples an apparatus includes an input terminal and a processing circuitry. The input terminal is to receive a LDPC frame. The LDPC frame includes bits having LLR values associated therewith. A portion of the bits have known values. The LLR values indicate probabilities that the bits have predetermined logic values. The processing circuitry is to saturate a subset of the LLR values corresponding to at least some of the portion of the bits having the known values to a highest possible magnitude and correct bits of the LDPC frame using message nodes and check nodes responsive to at least the LLR values. The message nodes correspond to the bits. The check nodes correspond to parity check equations of a parity check matrix.

FIG. 1 is a block diagram of a communication system 100, according to various examples. The communication system 100 includes a transmitter 102 and a receiver 104 electrically connected to each other via a network cable 110 (e.g., an Ethernet cable, without limitation). The receiver 104 includes a network interface 108 and a physical layer device 106.

The physical layer device 106 includes an input terminal 112 and a reduced complexity decoder 400. The input terminal 112 is provided at the physical layer device 106 to receive, from a network 114 (e.g., a wired local area network such as an Ethernet network, without limitation), an LDPC frame C 200 including bits. The bits of the LDPC frame C 200 correspond to LLR messages indicating probabilities that the bits have predetermined logic values.

The physical layer device 106 is to receive the LDPC frame C 200 via the network interface 108 and decode the LDPC frame C 200 to obtain a received data frame s 300. The physical layer device 106 may be implemented using a processing circuitry to saturate LLR values of a portion of the LLR messages corresponding to known bits of the LDPC frame C 200 to a highest magnitude value represented by the LLR messages. The processing circuitry may also be to pass the LLR messages between check nodes and message nodes. The message nodes correspond to the bits. The check nodes correspond to parity check equations of a parity check matrix.

Figure 2:
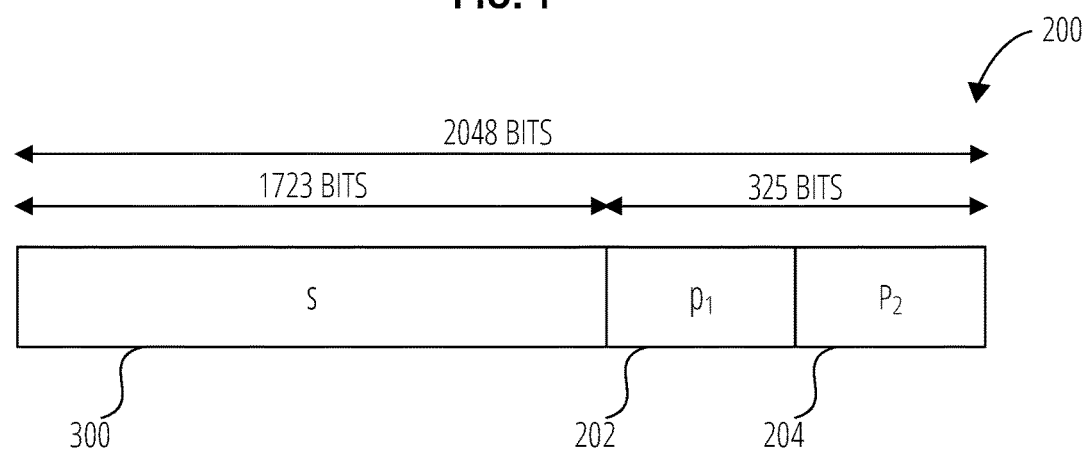
FIG. 2 illustrates an LDPC frame C provided by a transmitter of the communication system of FIG. 1, according to various examples.

FIG. 2 illustrates an LDPC frame C 200 provided by the transmitter 102 of the communication system 100 of FIG. 1, according to various examples. The LDPC frame C 200 includes the received data frame s 300 of FIG. 1, a first parity vector $p_1$ 202, and a second parity vector $p_2$ 204. By way of non-limiting example, the received data frame s 300 may be of length 1723 bits, as discussed below with reference to FIG. 3. Also by way of non-limiting example, the first parity vector $p_1$ 202 and the second parity vector $p_2$ 204 may combine for a total length of 325 bits. A total length of the LDPC frame C 200 may be 2048 bits.

Figure 3:
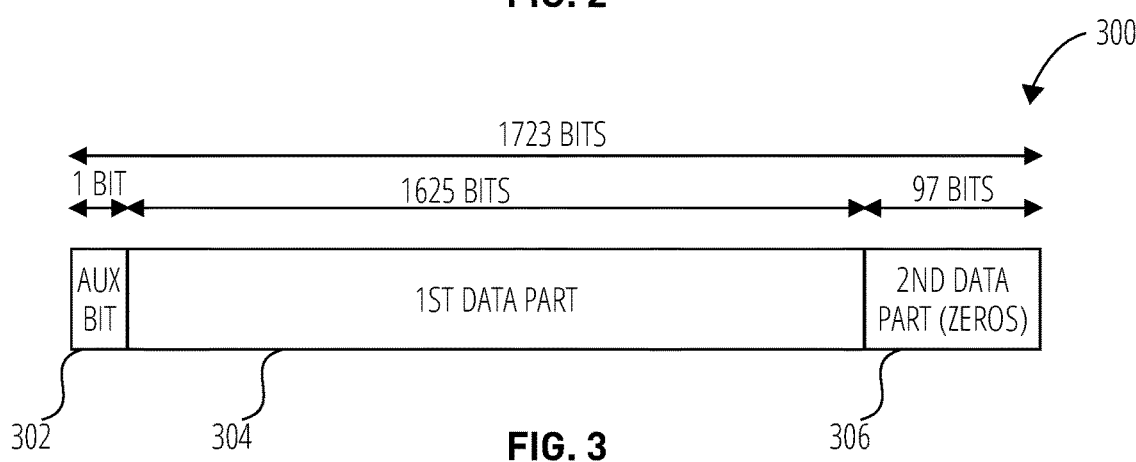
FIG. 3 illustrates a received data frame s provided by the reduced complexity decoder of FIG. 1, according to various examples.

FIG. 3 illustrates a received data frame s 300 provided by the reduced complexity decoder 400 of FIG. 1, according to various examples. The received data frame 300 (also shown as "s" 300 in FIG. 3) includes an auxiliary bit 302, a first data part 304, and a second data part 306. By way of non-limiting examples, the auxiliary bit 302 may be one bit long, the first data part 304 may be 1,625 bits long, and the second data part 306 may be 97 bits long. As illustrated in FIG. 3, the known bits of the LDPC frame C 200 may include a last nine-ty seven bits of the LDPC frame C 200 before parity vectors (the first parity vector $p_1$ 202 and the second parity vector $p_2$ 204). A total length of the received data frame s 300 may be 1,723 bits. The first data part 304 may include data bits (e.g., message bits, without limitation) that are communicated by the transmitter 102 (FIG. 1). As per the 2.5G/5G standard, the second data part 306 may all be zeros. Accordingly, the second data part 306 may include bits having known values (i.e., zeros).

Figure 4:
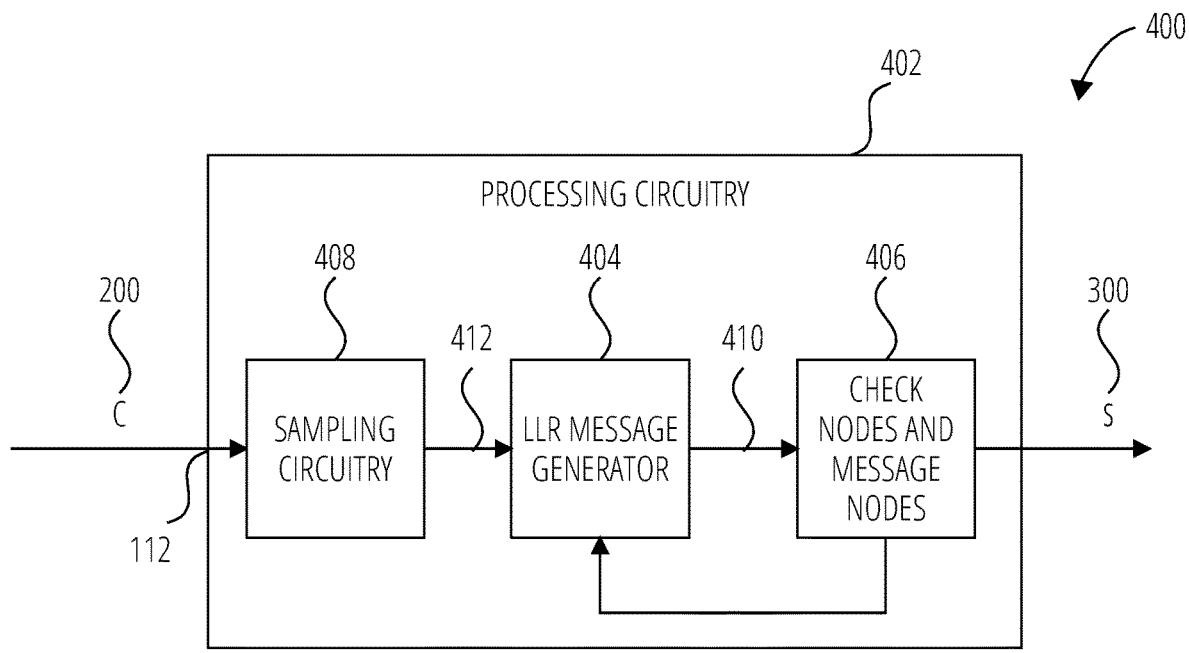
FIG. 4 is a block diagram of a reduced complexity decoder of a receiver 104 of the communication system of FIG. 1, according to various examples.

FIG. 4 is a block diagram of a reduced complexity decoder 400 of a receiver 104 of the communication system 100 of FIG. 1, according to various examples. The reduced complexity decoder 400 includes processing circuitry 402 to receive the LDPC frame C 200, decode the LDPC frame C 200, and provide the received data frame s 300. By way of non-limiting example, the LDPC frame C 200 may be communicated to the input terminal 112 of the processing circuitry 402 as a modulated signal (e.g., a pulse amplitude modulation (PAM) signal, without limitation). Also by way of non-limiting example, the LDPC frame C 200 may be communicated using a series of analog voltage potential values that each map to one or more bits of the LDPC frame C 200 (e.g., each voltage potential may correspond to four bits, without limitation). As a specific, non-limiting example, each different analog voltage potential value may be mapped to a different series of four bits. Accordingly, the processing circuitry 402 may include sampling circuitry 408 to sample the LDPC frame C 200, and provide a sampled LDPC frame 412.

Attenuation, noise, and other disruptions may, in some instances, introduce uncertainty as to whether specific voltage potential values sampled at the sampling circuitry 408 are the same as those that were to be conveyed to the sampling circuitry 408 by the transmitter 102 (FIG. 1). Accordingly, the LLR message generator 404 includes an LLR message generator 404 to receive the sampled LDPC frame 412 from the sampling circuitry 408, and generate LLR messages 410 indicating probabilities that the bits of the LDPC frame C 200 have predetermined logic values.

Since the second data part 306 of the received data frame s 300, which is part of the LDPC frame C 200, is known to include zeros, the LLR message generator 404 is to saturate those of the LLR messages 410 that correspond to the bits of the second data part 306 to the most positive value of the LLR messages 410 (e.g., +31.75, without limitation). By way of non-limiting example, a most positive value that the LLR messages 410 may convey may be a +31.75, which corresponds to a highest level of certainty conveyable by the LLR messages that a corresponding bit has a zero value.

The processing circuitry 402 further includes check nodes and message nodes 406. The check nodes and message nodes 406 are to correct the bits of the received data frame s 300 responsive to at least the LLR messages 410. The check nodes correspond to parity check equations of a parity check matrix (also referred to herein as an "H-matrix"). The message nodes correspond to bits of the LDPC frame C 200. In various examples each of the message bits contributes to six of the check nodes. The LLR messages 410 are passed between the check nodes and message nodes 406 until a solution for the received data frame s 300 is converged upon. For each sub-iteration of passing the messages between the check nodes and message nodes 406 the LLR message generator 404 may saturate the values of the LLR messages 410 that correspond to the known bits (e.g., the second data part 306, without limitation) of the LDPC frame C 200 to the highest possible positive value (e.g., at a start of each sub-iteration, without limitation).

The saturation of the LLR messages 410 that correspond to the known values of the LDPC frame C 200 may result in a quicker (i.e., fewer sub-iterations of passing the LLR messages 410 through the check nodes and message nodes 406) and/or a more accurate (i.e., fewer bit errors in the received data frame s 300 provided by the check nodes and message nodes 406) decoding of the received data frame s 300 from the LDPC frame C 200, as compared to a case where LLR messages corresponding to known values are not saturated.

Figure 5:
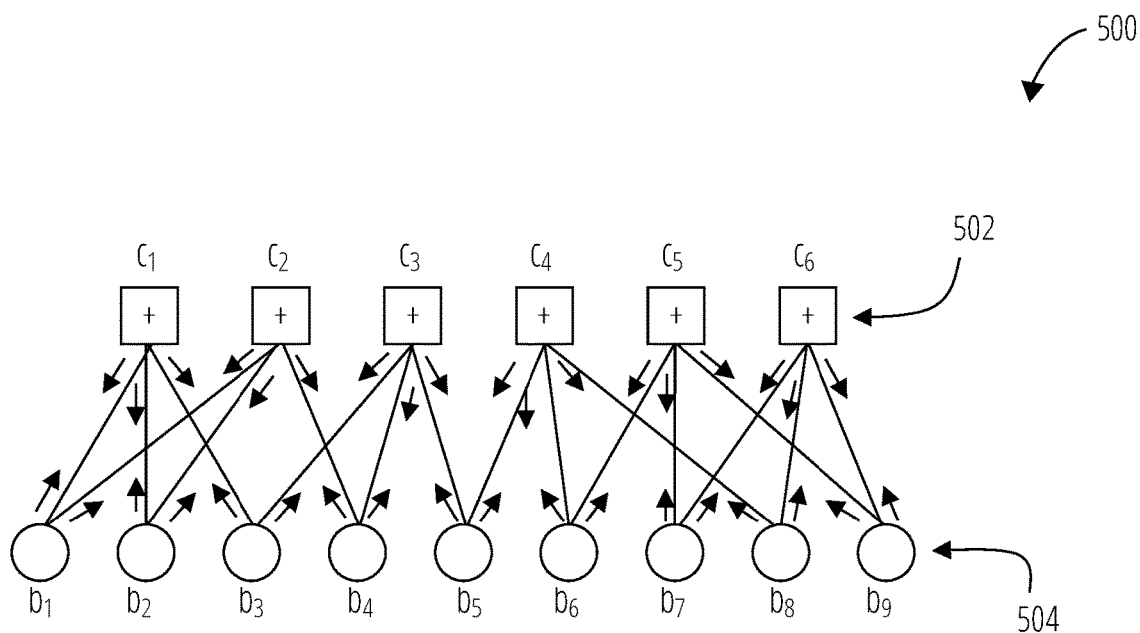
FIG. 5 illustrates a simple message passing algorithm having only six check nodes and nine message nodes, according to various examples.

FIG. 5 is a bipartite graph 500 of a (2,3)-LDPC code, according to various examples. The bipartite graph 500 illustrates a simple message passing algorithm having only six check nodes and nine message nodes. The message nodes 504 correspond to bits of a received LDPC frame C 200. The check nodes 502 correspond to parity check equations of a parity check matrix (the H-matrix). The check nodes and message nodes 406 of the processing circuitry 402 of FIG. 4 may implement check nodes and message nodes such as the check nodes 502 and the message nodes 504 of the bipartite graph 500 of FIG. 5, without limitation.

Figure 6:
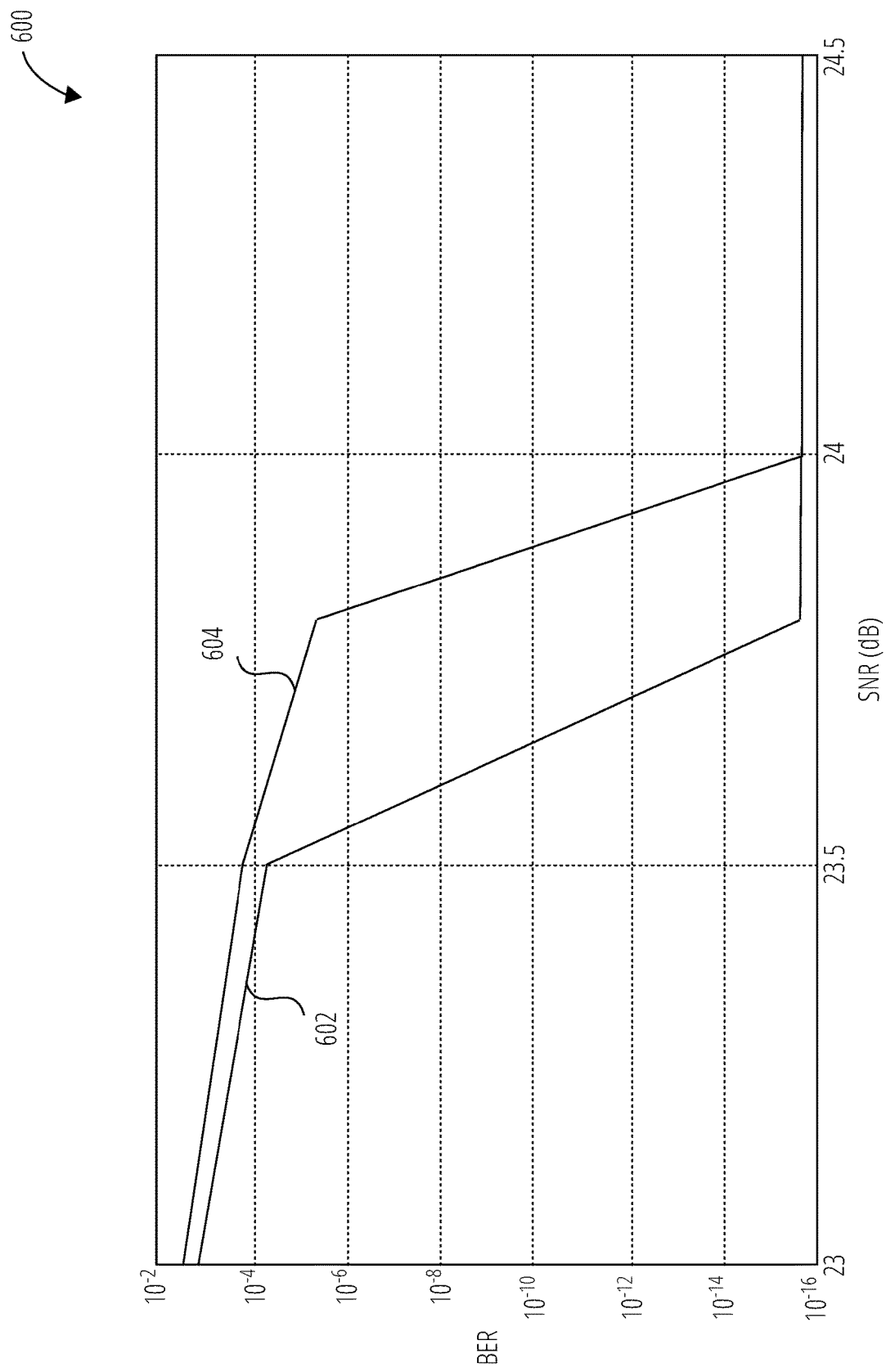
FIG. 6 is a bit error plot illustrating an example of an improved bit error rate according to examples disclosed herein and a conventional bit error rate.

FIG. 6 is a bit error plot 600 illustrating an example of an improved bit error rate 602 according to examples disclosed herein and a conventional bit error rate 604. The improved bit error rate 602 is a bit error rate of a decoded received data frame 300 resulting from saturating the LLR values of the LLR messages 410 (FIG. 4) associated with the known values (zeros) of the bits of the second data part 306 (FIG. 3) of the received data frame s 300. The conventional bit error rate 604 is a bit error rate of a decoded received data frame s 300 resulting from not saturating the LLR values of the LLR messages 410 associated with the known values of the bits of the second data part 306. As may be observed from the bit error plot 600, saturation of the known values of the LLR messages 410 improves (i.e., reduces) the number of uncorrected errors of the received data frame s 300, in addition to a reduction in the number of sub-layer runs (sub-iterations) used for algorithm convergence. Improvement in the number of uncorrected errors improves BER. Reduction in the number of sub-layer runs may also cause significant power savings, as the design will be clock gated for those unused sub-layers for each frame.

FIG. 6 shows better error correction corresponding to the improved bit error rate 602 than for the case corresponding to the conventional bit error rate 604. The plot of FIG. 6 was derived by driving 5000 random LDPC frames into two different decoding engines: one using saturation of LLR messages corresponding to known values (improved bit error rate 602), the other without saturating the LLR messages corresponding to the known values (conventional bit error rate 604). These LDPC frames were corrupted using additive white Gaussian noise (AWGN) with variance related to various SNR values shown in the plot. The improved bit error rate 602 and the conventional bit error rate 604 are plotted against these SNR values.

For the SNR value of 23 dB, the number of uncorrected errors is lower for the improved bit error rate 602 than for the conventional bit error rate 604 by 16,535 bits (=32,312-15,777). For the SNR value of 23.5 dB, the number of uncorrected errors is lower for the improved bit error rate 602 than for the conventional bit error rate 604 by 1,147 bits (=1,651-504). The improved bit error rate 602 reduces to zero substantially zero just after halfway between SNRs of 23.5 and 24, whereas the conventional bit error rate 604 may not converge to substantially zero until an SNR of substantially 24.

Figure 7:
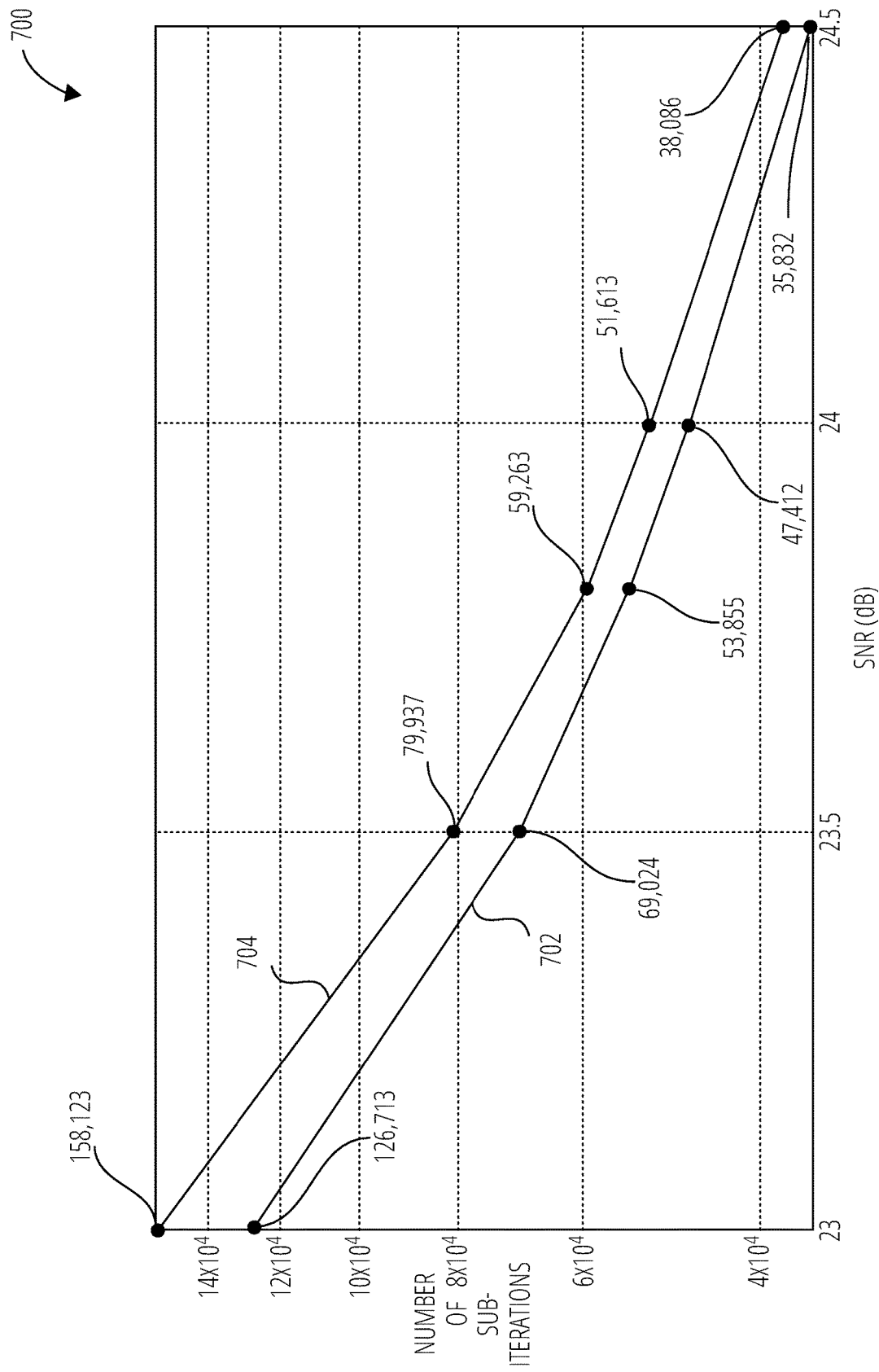
FIG. 7 is a sub-iteration plot illustrating an example of improved sub-iteration counts and conventional sub-iteration counts.

FIG. 7 is a sub-iteration plot 700 illustrating an example of improved sub-iteration counts 702 and conventional sub-iteration counts 704. The improved sub-iteration counts 702 is a number of a sub-iterations used to converge on the received data frame s 300 resulting from saturating the LLR values of the LLR messages 410 (FIG. 4) associated with the known values (zeros) of the bits of the second data part 306 (FIG. 3) of the received data frame s 300. The conventional sub-iteration counts 704 is a number of sub-iterations used to converge on the received data frame s 300 resulting from not saturating the LLR values of the LLR messages 410 associated with the known values of the bits of the second data part 306. The example illustrated in FIG. 7 corresponds to the use of a maximum of ten iterations and using PAM-16 modulation.

FIG. 7 shows that a fewer number of sub-layer runs are used for convergence for various examples of the improved sub-iteration counts 702 than for the conventional sub-iteration counts 704. For example, the 704, for the SNR value of 23 dB, the total number of sub-layer iterations executed for 5,000 frames with saturating the LLR messages 410 is 31,410 less for the improved sub-iteration counts 702 than for the conventional sub-iteration counts 704 (158,123-126,713). For the SNR value of 23.5 dB, the total number of sub-layer iterations executed for 5,000 frames with saturating the LLR messages 410 is 10,913 less for the improved sub-iteration counts 702 than for the conventional sub-iteration counts 704 (79,937-69,024). For the SNR value of 23.8, the total number of sub-layer iterations is 5,412 less for the improved sub-iteration counts 702 than for the conventional sub-iteration counts 704 (59,263-53,855). For the SNR value of 24, the total number of sub-layer iterations is 4,201 less for the improved sub-iteration counts 702 than for the conventional sub-iteration counts 704 (51,613-47,412). For the SNR value of 24.5 the total number of sub-layer iterations is 2,254 less for the improved sub-iteration counts 702 than for the conventional sub-iteration counts 704 (38,086-35,832). The decoding engine may be clock gated for each unused sub-layer iteration, which results in significant power savings corresponding to the improved sub-iteration counts 702 as compared to the conventional sub-iteration counts 704.

Certain ones of the message nodes (e.g., the message nodes 504 of FIG. 5, without limitation) may have stronger LLR-values, indicating that the probability of a zero or a one is higher. To improve error correction, more certain message nodes may contribute to a check node (e.g., the check nodes 502 of FIG. 5, without limitation) and the strength of those message nodes may be higher. Accordingly, weaker message nodes may be corrected over multiple iterations. Out of the 2048 message nodes, nodes for which it is known the LLR values are stronger are identified. The LLR values corresponding to the known bits for these nodes for each sub-iteration execution in the algorithm are emphasized.

Log likelihood ratio may be expressed as the {logarithm of (probability of received message=0) divided by (probability of received message=1)}. If a received message bit is highly probable to be zero, then the LLR value of that message may be the highest positive value for the chosen bit width, and if a received message bit is highly probable to be one, then the LLR value of that message may be the highest negative value for the chosen bit width.

The known LLR values may be identified in LDPC frames. As per the 802.3bz standard, the last 97 bits before parity of each frame have the value of zero. Their contribution towards check nodes in decoding may be saturated to the highest positive value at the start of every sub-iteration. Accordingly, examples disclosed herein for decoding may include identifying that for each bit having an index (idx) of =1,626 to 1,723, $L_i(1,idx)$=31.75, assuming eight bits Q(6.2) width for $L_i$. Then the Q calculation, R calculation, L calculation, and a decision algorithm discussed above may be performed.

It is shown that the LLR has been saturated to its maximum value at the start of each sub-iteration instead of using the LLR values that are received from the line. For Q6.2 bit width the saturation value that is used is +31.75. As a result, the 97-bit optimization disclosed herein is distinguished from the Q calculation, R calculation, L calculation, and a decision algorithm discussed above in that rather than not saturating LLR messages corresponding to the known bits in the frame and using the log-likelihood ratios as received from the line for the known bits, the LLR values for LLR messages corresponding to the known values of the second data part 306 (FIG. 3) are saturated at the start of every sub-iteration. Using the known information (the known values of the second data part 306) may help achieve convergence sooner, and also more errors may be corrected within a maximum number of iterations.

In various examples a configurable switch may be used to turn on and turn off the utilization of the known bits from the frame. For example, when the switch is turned off the Q calculation, R calculation, L calculation, and a decision algorithm discussed above may be performed without changing the algorithm for idx=1626 to 1723. When the switch is turned on, however, the known bits corresponding to indices idx 1626 to 1723 may be utilized to saturate the contribution towards the check nodes to the highest positive value (e.g., +31.75, without limitation) at the start of the sub-iteration.

A randomly selected uncorrectable received frame was decoded without saturating the LLR messages corresponding to the known 97 bits of the frame and with utilizing the known 97 bits of the frame. The number of uncorrected errors resulting from not utilizing the known 97 bits was eighty errors. In contrast, the number of uncorrected errors resulting from utilizing the known 97 bits was fifty-five.

Similarly, a randomly selected correctable received frame was decoded without utilizing the known 97 bits of the frame and with utilizing the known 97 bits of the frame. Not utilizing the known 97 bits resulted in convergence following two iterations and six sub-iterations. Utilizing the known 97 bits, however, resulted in convergence following two iterations and only five sub-iterations.

Figure 8:
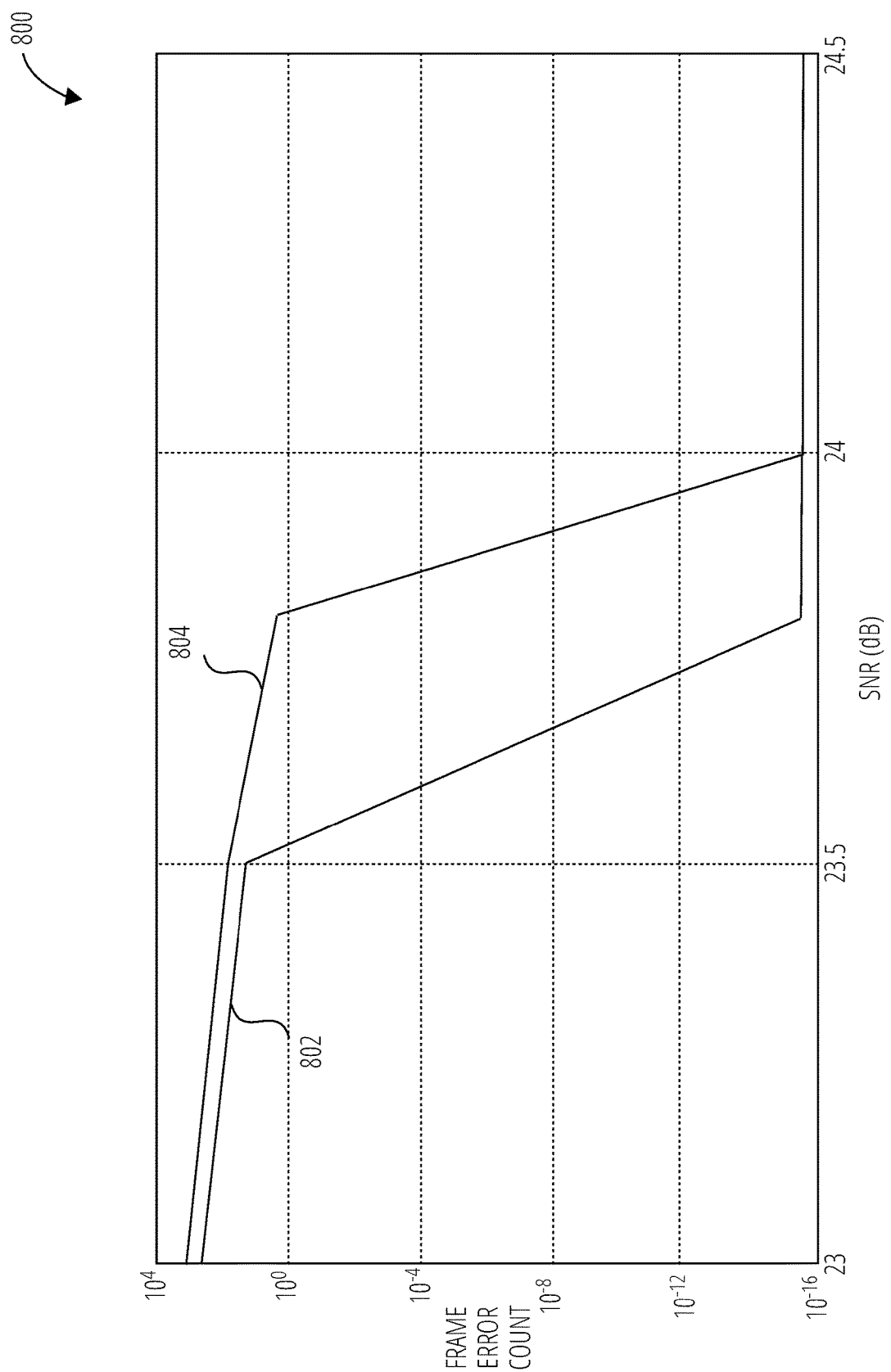
FIG. 8 is a frame error count plot illustrating an example of an improved frame error count according to examples disclosed herein and a conventional frame error count.

FIG. 8 is a frame error count plot 800 illustrating an example of an improved frame error count 802 according to examples disclosed herein and a conventional frame error count 804. The improved frame error count 802 is a frame error count of a decoded received data frame s 300 resulting from saturating the LLR values of the LLR messages 410 (FIG. 4) associated with the known values (zeros) of the bits of the second data part 306 (FIG. 3) of the received data frame s 300. The conventional frame error count 804 is a frame error count of a decoded received data frame s 300 resulting from not saturating the LLR values of the LLR messages 410 associated with the known values of the bits of the second data part 306.

At an SNR of 23 dB the improved frame error count 802 may be 497 less than the conventional frame error count 804 (957-460). At an SNR of 23.5 dB the improved frame error count 802 may be 39 less than the conventional frame error count 804 (56-17). At an SNR of 23.8 dB the improved frame error count 802 may be 2 less than the conventional frame error count 804 (2-0). The improved frame error count 802 may converge to substantially zero before the conventional frame error count 804 (e.g., at 23.8 dB for improved frame error count 802 vs. 24 dB for the conventional frame error count 804, without limitation).

Figure 9:
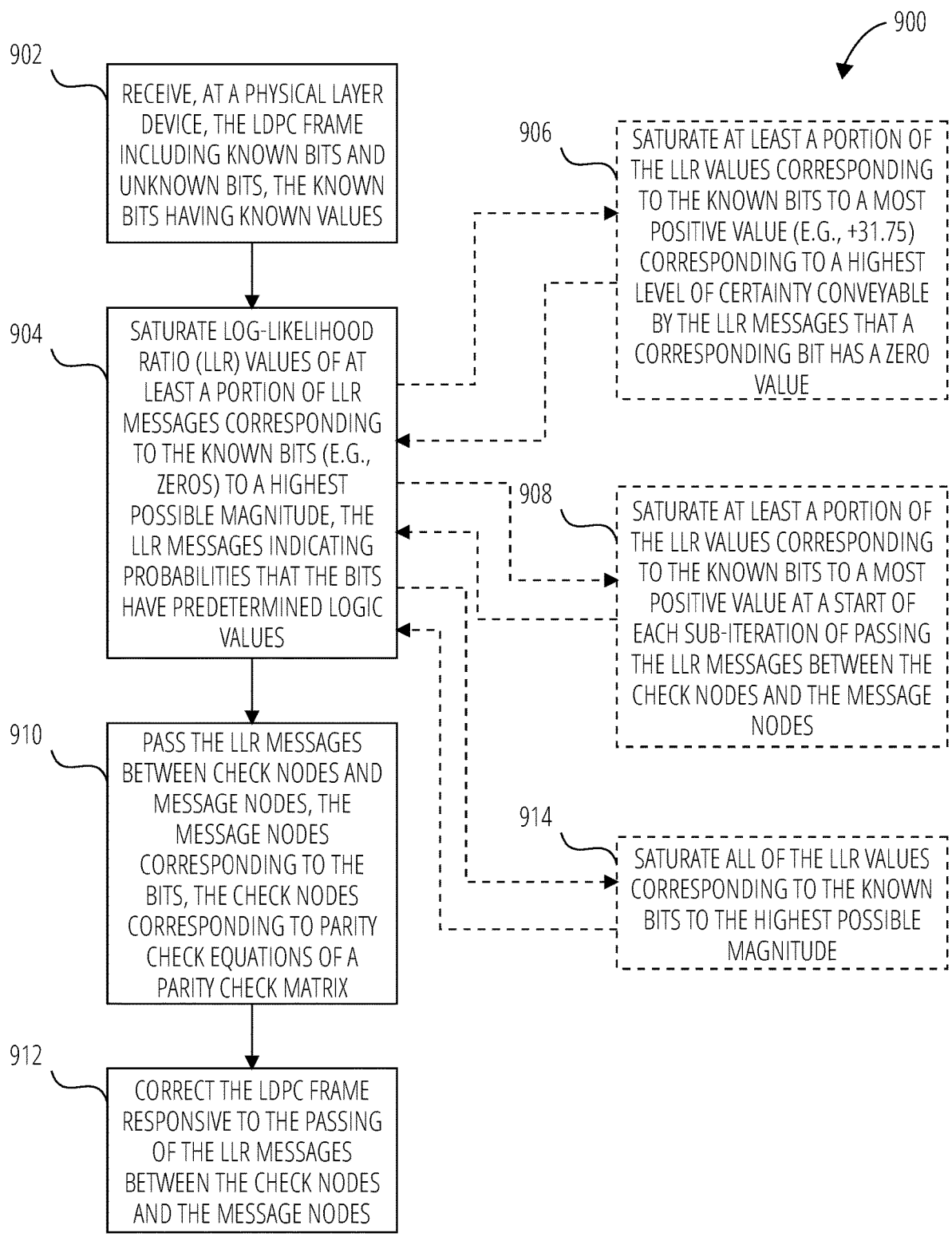
FIG. 9 is a flowchart illustrating a method of decoding an LDPC frame, according to various examples.

FIG. 9 is a flowchart illustrating a method 900 of decoding an LDPC frame, according to various examples. At operation 902 the method 900 includes receiving, at a physical layer device, the LDPC frame including known bits and unknown bits. The known bits have known values (e.g., zeros, without limitation).

At operation 904 the method 900 includes saturating LLR values of at least a portion of LLR messages corresponding to the known bits to a highest possible magnitude. The LLR messages indicate probabilities that the bits have predetermined logic values. In various examples at operation 906 saturating the LLR values of at least a portion of the LLR messages corresponding to the known bits to the highest possible magnitude includes saturating the at least a portion of the LLR values corresponding to the known bits to a most positive value (e.g., +31.75, without limitation) corresponding to a highest level of certainty conveyable by the LLR messages that a corresponding bit has a zero value. In various examples at operation 908 saturating the LLR values of at least a portion of the LLR messages corresponding to the known bits to the highest possible magnitude includes saturating the at least the portion of the LLR values corresponding to the known bits to the most positive value at a start of each sub-iteration of passing the LLR messages between the check nodes and the message nodes. In various examples at operation 914 saturating the LLR values of at least a portion of the LLR messages corresponding to the known bits to the highest possible magnitude includes saturating all of the LLR values corresponding to the known bits to the highest possible magnitude.

At operation 910 the method 900 includes passing the LLR messages between check nodes and message nodes. The message nodes correspond to the bits. The check nodes correspond to parity check equations of a parity check matrix.

At operation 912 the method 900 includes correcting the LDPC frame responsive to the passing of the LLR messages between the check nodes and the message nodes.

Figure 10:
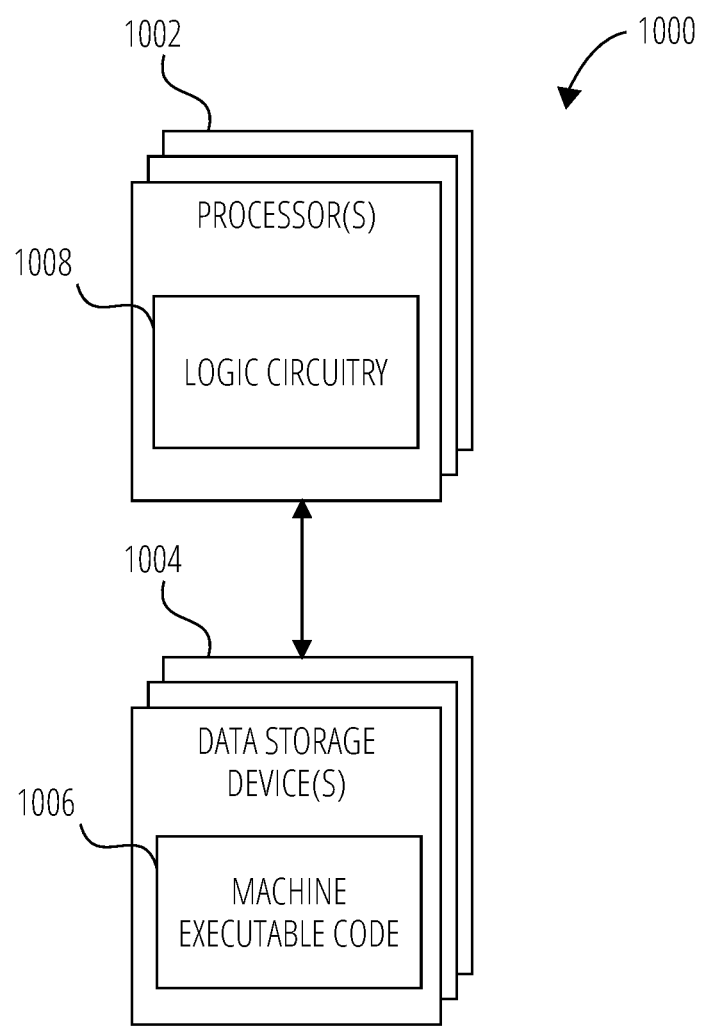
FIG. 10 is a block diagram of circuitry that, in various examples, may be used to implement various functions, operations, acts, processes, and/or methods disclosed herein.

It will be appreciated by those of ordinary skill in the art that functional elements of examples disclosed herein (e.g., functions, operations, acts, processes, and/or methods, without limitation) may be implemented in any suitable hardware, software, firmware, or combinations thereof. FIG. 10 illustrates non-limiting examples of implementations of functional elements disclosed herein. In some examples, some or all portions of the functional elements disclosed herein may be performed by hardware specially configured for carrying out the functional elements.

FIG. 10 is a block diagram of circuitry 1000 that, in some examples, may be used to implement various functions, operations, acts, processes, and/or methods disclosed herein. The circuitry 1000 includes one or more processors 1002 (sometimes referred to herein as "processors 1002") operably coupled to one or more data storage devices (sometimes referred to herein as "storage 1004"). The storage 1004 includes machine executable code 1006 stored thereon and the processors 1002 include logic circuitry 1008. The machine executable code 1006 includes information describing functional elements that may be implemented by (e.g., performed by) the logic circuitry 1008. The logic circuitry 1008 is adapted to implement (e.g., perform) the functional elements described by the machine executable code 1006. The circuitry 1000, when executing the functional elements described by the machine executable code 1006, should be considered as special purpose hardware configured for carrying out functional elements disclosed herein. In some examples the processors 1002 may be to perform the functional elements described by the machine executable code 1006 sequentially, concurrently (e.g., on one or more different hardware platforms), or in one or more parallel process streams.

When implemented by logic circuitry 1008 of the processors 1002, the machine executable code 1006 is to adapt the processors 1002 to perform operations of examples disclosed herein. By way of non-limiting example, the machine executable code 1006 may be to adapt the processors 1002 to perform the method 900 of FIG. 9. Also by way of non-limiting example, the machine executable code 1006 may be to adapt the processors 1002 to perform operations disclosed herein for the receiver 104 of FIG. 1, the network interface 108 of FIG. 1, the physical layer device 106 of FIG. 1, the reduced complexity decoder 400 of FIG. 1 and FIG. 4, the sampling circuitry 408 of FIG. 4, the LLR message generator 404 of FIG. 4, and/or the check nodes and message nodes 406 of FIG. 4. As another non-limiting example, the machine executable code 1006 may be to adapt the processors 1002 to implement such check nodes and message nodes such as the check nodes 502 and the message nodes 504 of FIG. 5.

The processors 1002 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer is to execute functional elements corresponding to the machine executable code 1006 (e.g., software code, firmware code, hardware descriptions, without limitation) related to examples of the present disclosure. It is noted that a general-purpose processor (may also be referred to herein as a host processor or simply a host) may be a microprocessor, but in the alternative, the processors 1002 may include any conventional processor, controller, microcontroller, or state machine. The processors 1002 may also be implemented as a combination of computing devices, such as a combination of a DSP and a microprocessor, a plurality of microprocessors, one or more microprocessors in conjunction with a DSP core, or any other such configuration.

In some examples the storage 1004 includes volatile data storage (e.g., random-access memory (RAM)), non-volatile data storage (e.g., Flash memory, a hard disc drive, a solid state drive, erasable programmable read-only memory (EPROM), without limitation). In some examples the processors 1002 and the storage 1004 may be implemented into a single device (e.g., a semiconductor device product, a system on chip (SOC), without limitation). In some examples the processors 1002 and the storage 1004 may be implemented into separate devices.

In some examples the machine executable code 1006 may include computer-readable instructions (e.g., software code, firmware code, without limitation). By way of non-limiting example, the computer-readable instructions may be stored by the storage 1004, accessed directly by the processors 1002, and executed by the processors 1002 using at least the logic circuitry 1008. Also by way of non-limiting example, the computer-readable instructions may be stored on the storage 1004, transferred to a memory device (not shown) for execution, and executed by the processors 1002 using at least the logic circuitry 1008. Accordingly, in some examples the logic circuitry 1008 includes electrically configurable logic circuitry 1008.

In some examples the machine executable code 1006 may describe hardware (e.g., circuitry) to be implemented in the logic circuitry 1008 to perform the functional elements. This hardware may be described at any of a variety of levels of abstraction, from low-level transistor layouts to high-level description languages. At a high-level of abstraction, a hardware description language (HDL) such as an IEEE Standard hardware description language (HDL) may be used. By way of non-limiting examples, VERILOG™ SYSTEMVERILOG™ or very large scale integration (VLSI) hardware description language (VHDL™) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuitry 1008 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some examples the machine executable code 1006 may include an HDL, an RTL, a GL description, a mask level description, other hardware description, or any combination thereof.

In examples where the machine executable code 1006 includes a hardware description (at any level of abstraction), a system (not shown, but including the storage 1004) may be to implement the hardware description described by the machine executable code 1006.

By way of non-limiting example, the processors 1002 may include a programmable logic device (e.g., an FPGA or a PLC) and the logic circuitry 1008 may be electrically controlled to implement circuitry corresponding to the hardware description into the logic circuitry 1008. Also by way of non-limiting example, the logic circuitry 1008 may include hard-wired logic manufactured by a manufacturing system (not shown, but including the storage 1004) according to the hardware description of the machine executable code 1006.

Regardless of whether the machine executable code 1006 includes computer-readable instructions or a hardware description, the logic circuitry 1008 is adapted to perform the functional elements described by the machine executable code 1006 when implementing the functional elements of the machine executable code 1006. It is noted that although a hardware description may not directly describe functional elements, a hardware description indirectly describes functional elements that the hardware elements described by the hardware description are capable of performing.

EXAMPLES

A non-exhaustive, non-limiting list of examples follows. Not each of the examples listed below is explicitly and individually indicated as being combinable with all others of the examples listed below and examples discussed above. It is intended, however, that these examples are combinable with all other examples unless it would be apparent to one of ordinary skill in the art that the examples are not combinable.

Example 1: An apparatus comprising: an input terminal provided at a physical layer device to receive, from a network, a low density parity check (LDPC) frame including bits, the bits corresponding to log-likelihood ratio (LLR) messages indicating probabilities that the bits have predetermined logic values; and a processing circuitry to: saturate LLR values of a portion of the LLR messages corresponding to known bits of the LDPC frame to a highest magnitude value represented by the LLR messages; and pass the LLR messages between check nodes and message nodes, the message nodes corresponding to the bits, the check nodes corresponding to parity check equations of a parity check matrix.

Example 2: The apparatus of Example 1, wherein the known bits of the LDPC frame comprise a last ninety-seven bits of the LDPC frame before parity vectors of the LDPC frame.

Example 3: The apparatus according to any one of Examples 1 and 2, wherein the highest magnitude value is a most positive value of the LLR messages.

Example 4: The apparatus of Example 3, wherein the most positive value corresponds to highest level of certainty conveyable by the LLR messages that a corresponding bit has a zero value.

Example 5: The apparatus according to any one of Examples 3 and 4, wherein the most positive value is +31.75.

Example 6: The apparatus according to any one of Examples 1-5, wherein the known bits have a logic value of zero.

Example 7: A method of decoding a low density parity check (LDPC) frame, the method comprising: receiving, at a physical layer device, the LDPC frame including known bits and unknown bits, the known bits having known values; saturating log-likelihood ratio (LLR) values of at least a portion of LLR messages corresponding to the known bits to a highest possible magnitude, the LLR messages indicating probabilities that the bits have predetermined logic values; and passing the LLR messages between check nodes and message nodes, the message nodes corresponding to the bits, the check nodes corresponding to parity check equations of a parity check matrix.

Example 8: The method of Example 7, comprising correcting the LDPC frame responsive to the passing of the LLR messages between the check nodes and the message nodes.

Example 9: The method according to any one of Examples 7 and 8, wherein saturating the LLR values of at least a portion of the LLR messages corresponding to the known bits to the highest possible magnitude comprises saturating at least a portion of the LLR values corresponding to the known bits to a most positive value.

Example 10: The method according to any one of Examples 7-9, wherein the known values of the known bits are zeros.

Example 11: The method according to any one of Examples 7-10, wherein saturating the LLR values of at least a portion of the LLR messages corresponding to the known bits to the highest possible magnitude includes saturating at least a portion of the LLR to the known bits to the highest possible magnitude at a start of each sub-iteration of passing the LLR messages between the check nodes and the message nodes.

Example 12: The method according to any one of Examples 7-11, wherein saturating the LLR values of at least a portion of the LLR messages corresponding to the known bits to the highest possible magnitude includes saturating the LLR values of all the LLR messages corresponding to the known bits to the highest possible magnitude.

Example 13: An apparatus, comprising: an input terminal to receive a low density parity check (LDPC) frame, the LDPC frame including bits having log likelihood ratio (LLR) values associated therewith, a portion of the bits having known values, the LLR values indicating probabilities that the bits have predetermined logic values; and a processing circuitry to: saturate a subset of the LLR values corresponding to at least some of the portion of the bits having the known values to a highest possible magnitude; and correct bits of the LDPC frame using message nodes and check nodes responsive to at least the LLR values, the message nodes corresponding to the bits, the check nodes corresponding to parity check equations of a parity check matrix.

Example 14: The apparatus of Example 13, wherein the processing circuitry saturates the subset of the LLR values corresponding to the portion of the bits having the known values to a most positive value.

Example 15: The apparatus according to any one of Examples 13 and 14, wherein the known values are zeros.

Example 16: The apparatus according to any one of Examples 13-15, wherein the LDPC frame includes: a first data part including message bits; and a second data part including the portion of the bits having the known values.

Example 17: The apparatus of Example 16, wherein each of the message bits contributes to six of the check nodes.

Example 18: The apparatus according to any one of Examples 13-17, wherein the LDPC frame includes a first parity vector and a second parity vector.

Example 19: The apparatus according to any one of Examples 13-18, wherein the processing circuitry saturates at least a portion of the subset of the LLR values corresponding to the portion of the bits having the known values to the highest possible magnitude at a start of each sub-iteration.

Example 20: The apparatus according to any one of Examples 13-19, wherein the processing circuitry saturates LLR values corresponding to all of the portion of the bits having the known values to the highest possible magnitude.

Example 21: A decoder for a physical layer device, the decoder comprising: an input line configured to receive, from a wired line of a wired local area network, soft log-likelihood ratio (LLR) messages corresponding to bits of a frame; and logic circuitry configured to: saturate LLR messages corresponding to known bits of the frame to a most positive value; and pass soft LLR messages corresponding to unknown bits of the frame between check nodes and message nodes.

Example 22. The decoder of Example 21, wherein the known bits of the frame comprise a last ninety-seven bits before parity vectors of the frame.

Example 23. The decoder according to any one of Examples 21 and 22, wherein the most positive value is +31.75.

Example 24. The decoder according to any one of Examples 21-23, wherein the known bits have a value of zero.

Example 25. A method of decoding a frame, the method comprising: receiving, at a physical layer device of a wired local area network, a frame including known bits and unknown bits, the known bits having known values; saturating LLR messages corresponding to the known bits to a most positive value; and passing soft LLR messages corresponding to the unknown bits between check nodes and message nodes.

CONCLUSION

As used in the present disclosure, the terms "module" or "component" may refer to specific hardware implementations to perform the actions of the module or component and/or software objects or software routines that may be stored on and/or executed by general purpose hardware (e.g., computer-readable media, processing devices, without limitation) of the computing system. In some examples, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," without limitation).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, without limitation" or "one or more of A, B, and C, without limitation" is used, in general such a construction is intended to include A alone, B alone, C alone, A and B together, A and C together, B and C together, or A, B, and C together, without limitation.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated examples, those of ordinary skill in the art will recognize and appreciate that the present invention is not so limited. Rather, many additions, deletions, and modifications to the illustrated and described examples may be made without departing from the scope of the invention as hereinafter claimed along with their legal equivalents. In addition, features from one example may be combined with features of another example while still being encompassed within the scope of the invention as contemplated by the inventor.

What is claimed is:

1. An apparatus comprising:
    a terminal provided at a physical layer device to receive, from a network, a low density parity check (LDPC) frame including bits, the bits corresponding to log-likelihood ratio (LLR) messages indicating probabilities that the bits have predetermined logic values; and
    a processing circuitry to:
        pass the LLR messages between check nodes and message nodes, the message nodes corresponding to the bits, the check nodes corresponding to parity check equations of a parity check matrix; and
        saturate LLR values of a portion of the LLR messages corresponding to known bits of the LDPC frame to a highest magnitude value represented by the LLR messages at a start of each sub-iteration of passing the LLR messages between the check nodes and the message nodes.

2. The apparatus of claim 1, wherein the known bits of the LDPC frame comprise a last ninety-seven bits of the LDPC frame before parity vectors of the LDPC frame.

3. The apparatus of claim 1, wherein the highest magnitude value corresponds to highest level of certainty conveyable by the LLR messages that a corresponding bit has a zero value.

4. The apparatus of claim 3, wherein the highest magnitude value is +31.75.

5. The apparatus of claim 1, wherein the known bits have a logic value of zero.

6. A method of decoding a low density parity check (LDPC) frame, the method comprising:
    receiving, at a physical layer device, the LDPC frame including known bits and unknown bits, the known bits having known values;
    passing log-likelihood ratio (LLR) messages between check nodes and message nodes, the message nodes corresponding to the known bits and the unknown bits, the check nodes corresponding to parity check equations of a parity check matrix, the LLR messages indicating probabilities that the known bits and the unknown bits have predetermined logic values; and
    saturating LLR values of at least a portion of the LLR messages corresponding to the known bits to a highest possible magnitude at a start of each sub-iteration of passing the LLR messages between the check nodes and the message nodes.

7. The method of claim 6, comprising correcting the LDPC frame responsive to the passing of the LLR messages between the check nodes and the message nodes.

8. The method of claim 6, wherein the known values of the known bits are zeros.

9. The method of claim 6, wherein saturating the LLR values of at least portion of the LLR messages corresponding to the known bits to the highest possible magnitude includes saturating the LLR values of all the LLR messages corresponding to the known bits to the highest possible magnitude.

10. An apparatus, comprising:
    a terminal to receive a low density parity check (LDPC) frame, the LDPC frame including bits having log likelihood ratio (LLR) values associated therewith, a portion of the bits having known values, the LLR values indicating probabilities that the bits have predetermined logic values; and
    a processing circuitry to:
        correct bits of the LDPC frame using message nodes and check nodes responsive to at least the LLR values, the message nodes corresponding to the bits, the check nodes corresponding to parity check equations of a parity check matrix; and
        saturate a subset of the LLR values corresponding to the portion of the bits having the known values to a highest possible magnitude at a start of each sub-iteration.

11. The apparatus of claim 10, wherein the known values are zeros.

12. The apparatus of claim 10, wherein the LDPC frame includes:
    a first data part including message bits; and
    a second data part including the portion of the bits having the known values.

13. The apparatus of claim 12, wherein each of the message bits contributes to six of the check nodes.

14. The apparatus of claim 10, wherein the LDPC frame includes a first parity vector and a second parity vector.

* * * * *